(12) United States Patent
Choi et al.

(10) Patent No.: US 9,088,287 B2
(45) Date of Patent: Jul. 21, 2015

(54) DIVIDED CLOCK GENERATION DEVICE AND DIVIDED CLOCK GENERATION METHOD

(71) Applicant: SAMSUNG ELECTRONICS CO., LTD., Suwon-si, Gyeonggi-do (KR)

(72) Inventors: Hun-Dae Choi, Seoul (KR); In-Dal Song, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/193,595

(22) Filed: Feb. 28, 2014

(65) Prior Publication Data

US 2014/0253188 A1 Sep. 11, 2014

(30) Foreign Application Priority Data

Mar. 6, 2013 (KR) ........................ 10-2013-0224126

(51) Int. Cl.
*H03K 23/42* (2006.01)
*H03K 23/66* (2006.01)

(52) U.S. Cl.
CPC .............. *H03K 23/42* (2013.01); *H03K 23/667* (2013.01)

(58) Field of Classification Search
CPC ............................ H03K 23/42; H03K 23/667
USPC .................................................. 327/115, 117
See application file for complete search history.

(56) References Cited

U.S. PATENT DOCUMENTS

| 5,719,644 | A | * | 2/1998 | Park | ................................ | 348/715 |
| 5,834,956 | A | * | 11/1998 | Pathikonda et al. | ........... | 327/116 |
| 6,188,641 | B1 | * | 2/2001 | Uchida | ..................... | 365/230.06 |
| 6,326,993 | B1 | * | 12/2001 | Satoh et al. | .................... | 347/252 |
| 6,707,726 | B2 | * | 3/2004 | Nishio et al. | ............. | 365/189.12 |
| 7,681,062 | B2 | * | 3/2010 | Kuroki | ........................... | 713/400 |
| 7,764,759 | B2 | * | 7/2010 | Gupta et al. | .................. | 375/355 |
| 8,045,406 | B2 | | 10/2011 | Kwon et al. | | |
| 8,736,317 | B2 | * | 5/2014 | Yeo et al. | ...................... | 327/115 |
| 2001/0007136 | A1 | * | 7/2001 | Tamura et al. | ................. | 713/500 |
| 2002/0125923 | A1 | * | 9/2002 | Chang et al. | .................. | 327/115 |
| 2010/0141306 | A1 | * | 6/2010 | Doi et al. | ....................... | 327/117 |
| 2011/0205818 | A1 | * | 8/2011 | Moon et al. | .................... | 365/194 |
| 2012/0268170 | A1 | * | 10/2012 | Kondo | ............................ | 327/115 |

FOREIGN PATENT DOCUMENTS

| JP | 2004-164763 | 6/2004 |
| KR | 10-2003-0049303 A | 6/2003 |
| KR | 10-2003-0083921 A | 11/2003 |
| KR | 10-2005-0105558 A | 11/2005 |
| KR | 10-2007-0038670 A | 4/2007 |
| KR | 10-2012-0037191 A | 4/2012 |

* cited by examiner

*Primary Examiner* — Thomas J Hiltunen
(74) *Attorney, Agent, or Firm* — Lee & Morse, P.C.

(57) ABSTRACT

A clock generation device includes a flip-flop, a clock division unit, and a clock comparator. The flip-flop generates a chip selection signal synchronized with an internal clock signal. The clock division unit generates second divided clock signals based on a first divided clock signal. The clock comparator selects ones of the second divided clock signals based on the chip selection signal. The clock division unit divides the internal clock signal based on the first divided clock signal and the selected one of the second divided clock signals.

20 Claims, 10 Drawing Sheets

DIVIDED CLOCK GENERATION DEVICE AND DIVIDED CLOCK GENERATION METHOD

CROSS-REFERENCE TO RELATED APPLICATION

Korean Patent Application No. 10-2013-0024126, filed on Mar. 6, 2013, and entitled, "Divided Clock Generation and Divided Clock Generation Method," is incorporated by reference herein in its entirety.

BACKGROUND

1. Field

One or more embodiments herein relate to generation of timing signals.

2. Description of the Related Art

Many electronic devices include a divider. One type of divider receives an input signal having a certain frequency and generates an output signal with a lower frequency. The ratio of frequencies of the input and output signals may or may not be an integer. An example of such a divider is used in logic circuits including but not limited to flip-flops.

SUMMARY

In accordance with one embodiments, a divided clock generation device includes: a chip selection flip-flop to generate a chip selection signal synchronized with an internal clock signal; a clock division unit to generate second divided clock signals including a second divided even clock signal and a second divided odd clock signal, the clock division unit to generate the second divided clock signals based on a first divided clock signal; and a clock comparator to select one of the second divided clock signals based on the chip selection signal, wherein the clock division unit divides the internal clock signal based on the first divided clock signal and the selected one of the second divided clock signals.

The clock division unit may generate the second divided clock signals in synchronization with a falling edge of a first divided clock bar signal, and the first divided clock bar signal is a complementary signal to the first divided clock signal.

The clock division unit may include a clock gating logic unit to gate the first divided clock signal and the selected one of the second divided clock signals with each other and to output a result of the gating as the divided internal clock signal.

The device may include a non-operation detector to intercept the chip selection signal synchronized with the internal clock signal provided to the clock comparator, the non-operation detector to intercept the chip selected signal based on a command signal synchronized with the internal clock signal.

The clock division unit may generate the second divided clock signals synchronized with a rising edge of the first divided clock signal.

The clock division unit may include a clock multiplexer to perform a multiplexing operation for the first divided clock signal and the selected one of the second divided clock signals and may output a result of the multiplexer operation as the divided internal clock signal.

The first divided clock signal may be initially output as the internal clock signal, and the clock comparator may select one of the second divided clock signals based on a comparison of delays of the first divided clock signal and the second divided clock signals. A frequency of the second divided clock signal may be ½ of a frequency of the first divided clock signal.

The device may include a replica unit to delay the second divided clock signals in a same manner as a delay of the first divided clock signal and to provide the delayed signals to the clock comparator, wherein the first divided clock signal is initially output as the internal clock signal.

The device may include a chip selection buffer to convert the chip selection signal from a TTL level to a CMOS level, and to output the converted chip selection signal to be received by to the chip selection flip-flop.

In accordance with another embodiment, a method for generating clock signals includes outputting a first divided clock signal as an internal clock signal, generating second divided clock signals based on the first divided clock signal, the second divided clock signals including a second divided even clock signal and a second divided odd clock signal, generating a chip selection signal synchronized with the internal clock signal, selecting one of the second divided clock signals based on the chip selection signal, and dividing the internal clock signal based on the first divided clock signal and the selected one of the second divided clock signals.

The second divided clock signals may be generated in synchronization with a falling edge of a first divided clock bar signal, and the first divided clock bar signal is a complementary signal to the first divided clock signal.

Outputting the internal clock signal may be performed according to a result of gating the first divided clock signal and the selected one of the second divided clock signals with each other, a result of the gating to be output as the divided internal clock signal.

The second divided clock signals may be generated in synchronization with a rising edge of the first divided clock signal. The internal clock signal may be output based on a multiplexer operation performed for the first divided clock signal and the selected one of the second divided clock signals, and a result of the multiplexer operation may be output as the divided internal clock signal.

In accordance with another embodiment, a device includes a logic circuit to generate a chip selection signal, a divider to generate first and second divided clock signals based on a first clock signal, and a comparator to select the first or second divided clock signal based on the chip selection signal, wherein the first divided clock signal is synchronized with a predetermined edge of the first clock signal and wherein the second divided clock signal is delayed relative to the first divided clock signal.

The device may include a selection circuit to select the first clock signal or one of the first or second divided clock signals, wherein the logic circuit is to generate the chip selection signal based on the signal selected by the selection circuit. The first clock signal may have a first cycle time, and each of the first and second clock signals may have a second cycle time longer than the first cycle time. The divider may be a divider and the logic circuit may include a flip-flop.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
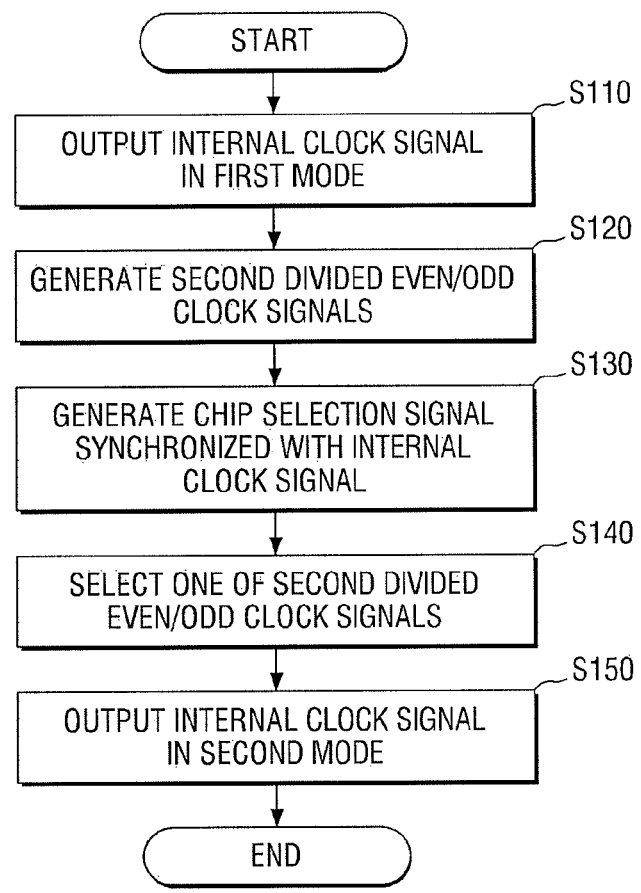
FIG. 1 illustrates an embodiment of a method for generating a divided clock.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

FIG. 1 illustrates an embodiment of a method of generating a divided clock. This and other embodiments described herein may be explained in the illustrative case of a DDR (Double Data Rate) SDRAM (Synchronous Dynamic RAM) memory device. However, these embodiments may just as easily be implemented in other memory or semiconductor devices.

Referring to FIG. 1, the divided clock generation method includes outputting an internal clock signal in a first mode (S110). The first mode may be, for example, a normal mode. In the normal mode, a first divided clock signal may be output as an internal clock signal. The first divided clock signal may be a signal that is obtained, for example, by buffering an external clock signal. Alternatively, the internal clock signal may be an undivided clock signal.

Next, second divided even/odd clock signals are generated when a sync pulse that indicates a second mode is input (S120). At this time, the plurality of second divided even/odd clock signals may be generated using the first divided clock signal. For example, each of the second divided clock signals may be obtained by dividing the first divided clock signal by a predetermined value n. Here, n may be a natural number that is equal to or larger than 2. Hereinafter, it is exemplified that the second divided clock signal is a signal that is obtained by dividing the first divided clock signal by a value of 2.

The second divided clock signal may be generated in synchronization with the first divided clock signal for two periods. For example, the second divided even clock signal may be a signal generated in synchronization with the 0-th (or even-numbered) pulse of the first divided clock signal. The second divided odd clock signal may be a signal that is generated in synchronization with the first (or odd-numbered) pulse of the first divided clock signal. Here, the term "x-th" may be divided, for example, on the basis of a time point when the sync pulse is input. The second divided clock signal may be generated in synchronization with a rising edge of the first divided clock signal or a falling edge of a first divided clock bar signal.

Next, a chip selection signal synchronized with the internal clock signal is generated (S130). At this time, since the first divided clock signal is output as the internal clock signal, the chip selection signal may be generated to be synchronized with the first divided clock signal. In one embodiment, the chip selection signal may be obtained by buffering an external chip selection signal.

Next, one of the plurality of second divided even/odd clock signals is selected (S140). At this time, any one of the plurality of second divided even/odd clock signals can be selected using the chip selection signal that is synchronized with the internal clock signal. The details thereof will be described in greater detail with reference to FIGS. 4 and 7.

Next, an internal clock signal is output in a second mode (S150). The second mode may be, for example, a geardown mode. According to one implementation, the frequency of the internal clock signal output in the geardown mode may be ½ of the frequency of the internal clock signal in a normal mode. Further, the cycle time of the internal clock signal output in the geardown mode may be twice the cycle time of the internal clock signal output in the normal mode.

The cycle of the internal clock signal output in the geardown mode may be ½ for example. In other embodiments, the cycle may be another value depending on the application. For example, in one embodiment, the duty of the internal clock signal output in the geardown mode may be less than ½. That is, since the geardown mode is a mode in which the frequency of the internal clock signal is decreased to be less than the frequency of the internal clock signal in the normal mode, the cycle of the internal clock signal may not matter.

The cycle may correspond to a ratio of time when the internal clock signal is at a high level with respect to one period of the internal clock signal. The internal clock signal in the second mode may be generated using the first divided clock signal and the one selected signal according to the result of the selection.

Figure 2:
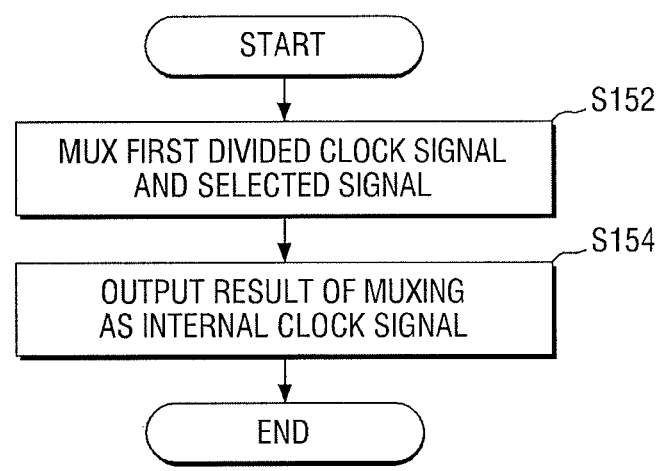
FIG. 2 illustrates an example operation of outputting an internal clock signal in a second mode of FIG. 1.

FIG. 2 illustrates an example of an operation of outputting an internal clock signal in a second mode of FIG. 1. More specifically, FIG. 2 corresponds to the illustrative case where a second divided clock signal is generated in synchronization with the rising edge of the first divided clock signal.

Referring to FIG. 2, in order to output an internal clock signal in a second mode, the first divided clock signal and any one signal selected from the plurality of second divided even/odd clock signals are input into a multiplexer (e.g., muxed) (S152). The signal selected by the multiplexer is output as the internal clock signal (S154). In the geardown mode, the first divided clock signal may not be selected, and the one selected signal may be output. On the other hand, in the normal mode, the internal clock signal in the normal mode is to be output, Thus, the first divided clock signal may be selected and output.

Figure 3:
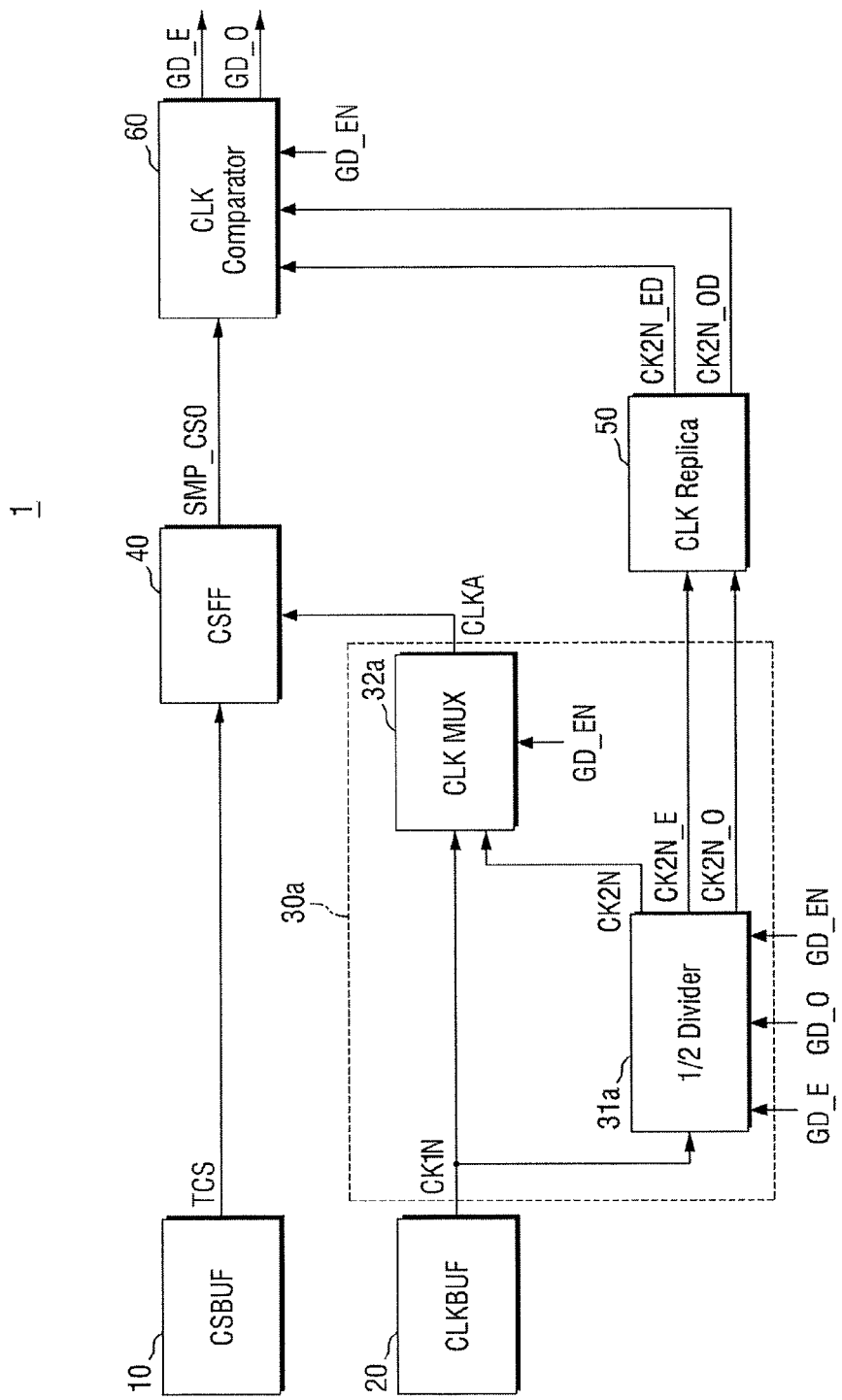
FIG. 3 illustrates an embodiment of a divided clock generation device that may operate according to the method of FIG. 2.

FIG. 3 illustrates one embodiment of a divided clock generation device that may operate, for example, according to the method of FIG. 2. Referring to FIG. 3, a divided clock generation device 1 includes a chip selection buffer (CS BUF) 10, a clock buffer (CLK BUF) 20, a division unit 30a, a chip selection flip-flop (CS FF) 40, a clock replica unit (CLK Replica) 50, and a clock comparator (CLK Comparator) 60. The chip selection buffer 10 may generate an internal chip selection signal TCS through buffering of an external chip selection signal. The external chip selection signal may be input, for example, at transistor-transistor logic (TTL) level. In one embodiment, the chip selection buffer 10 may receive the chip selection signal of TTL level from an external source, and generate the internal chip selection signal TCS based on a conversion of the TTL-level chip selection signal into a chip selection signal of a CMOS level. The chip selection buffer 10 may supply the internal chip selection signal TCS to the chip selection flip-flop 40. In other embodiments, the chip selection buffer 10 may perform a different conversion between at least one of the aforementioned levels and a different logic or signal level, or between two different logic or signal levels.

The clock buffer 20 may generate a first divided clock signal CK1N based on buffering of an external clock signal. The external clock signal may be input at TTL level. More specifically, the clock buffer 20 may receive a clock signal of TTL level from an external source, and generate the first divided clock signal CK1N through conversion of the clock signal of TTL level into a clock signal of CMOS level. The clock buffer 20 may supply the first divided clock signal CK1N to the division unit 30a.

The division unit 30a may output an internal clock signal CLKA. The division unit 30a may output the internal clock signal CLKA in a normal mode or in a geardown mode. As described above, the frequency of the internal clock signal CLKA in the geardown mode may be ½ of the frequency of the internal clock signal CLKA in the normal mode. Further, the cycle time of the internal clock signal CLKA in the geardown mode may be twice the cycle time of the internal clock signal CLKA in the normal mode.

At the power-up or reset of the system, the normal mode may be set by default, and the division unit 30a may output the internal clock signal CLKA in the normal mode. In order for the system to enter the geardown mode, an MRS geardown command may first be input to the system. Then, a sync pulse may be input together with a non-operation (NOP) command. As the sync pulse is input, the system may be set to the geardown mode, and the division unit 30a may output the internal clock signal CLKA in the geardown mode.

The division unit 30a may generate second divided even/odd clock signals CK2N_E and CK2N_O based on the first divided clock signal CK1N. In one embodiment, the division unit 30a may include a 1/n divider 31a, where n≥2. For illustrative purposes, divider 31a is shown as a ½ divider 31a.

The divider 31a may generate the second divided clock signals CK2N_E and CK2N_O in synchronization with the first divided clock signal CK1N for two periods. For example, divider 31a may generate second divided clock signals CK2N_E and CK2N_O in synchronization with a predetermined edge of the first divided clock signal CK1N. In one embodiment, divider 31a generates the second divided clock signals CK2N_E and CK2N_O in synchronization with the rising edge of the first divided clock signal CK1N. In other embodiments, the second divided clock signals may be synchronized with a falling edge of the first divided clock signal. The divider 31a may supply the second divided even/odd clock signals CK2N_E and CK2N_O to the clock replica unit 50.

The divider 31a may be enabled when a geardown enable signal GD_EN is input to generate the second divided clock signals CK2N_E and CK2N_O. The divider 31a may be disabled when the gear down enable signal GD_EN is not input (or has a logical value different from signal GD_EN used to enable the divider 31a). The divider 31a may not generate the second divided clock signals CK2N_E and CK2N_O when disabled. The geardown enable signal GD_EN may correspond to the MRS geardown command as described above.

The chip selection flip-flop 40 may generate a chip selection signal SMP_CS0 that is synchronized with the internal clock signal CLKA. The chip selection flip-flop 40 may synchronize the internal chip selection signal TCS with the internal clock signal CLKA, and supply the synchronized internal chip selection signal TCS to the clock comparator 60. Since the internal clock signal CLKA is initially output as the first divided clock signal CK1N, the chip selection flip-flop 40 may generate the chip selection signal SMP_CS0 synchronized with the first divided clock signal CK1N.

The clock replica unit 50 may delay the second divided even/odd clock signals CK2N_E and CK2N_O. The clock replica unit 50 may delay the plurality of second divided even/odd clock signals CK2N_E and CK2N_O in the same manner as the delay of the first divided clock signal CK1N. That is, the clock replica unit 50 replicates a path of the first divided clock signal CK1N which is supplied to the chip selection flip-flop 40 as the internal clock signal CLKA. Through this, the first divided clock signal CK1N and the delayed second divided even/odd clock signals CK2N_EN and CK2N_OD can be adjusted to have the same timing.

To accomplish this same timing, the clock replica unit 50 may be configured to measure the delay of the first divided clock signal CK1N in advance and to add the measured delay to the second divided even/odd clock signals CK2N_E and CK2N_O. In order to measure the delay of the first divided clock signal CK1N, a setup/hold margin of the chip selection signal SMP_CS0 that is synchronized with the first divided clock signal CK1N may be used. The clock replica unit 50 may provide the delayed second divided even/odd clock signals CK2N_ED and CK2N_OD to the clock comparator 60.

The clock comparator 60 selects one of the second divided even/odd clock signals CK2N_E and CK2N_O. The clock comparator 60 may perform this selection based on the chip selection signal SMP_CS0 that is synchronized with the internal clock signal CLKA. The clock comparator 60 may compare the delay of the first divided clock signal CLKA and the delay of the delayed second divided even/odd clock signals CK2N_ED and CK2N_OD with each other, and may select one of them.

The clock comparator 60 may provide a geardown even signal GD_E and a geardown odd signal GD_O to the division unit 30a as the result of the selection. For example, if the geardown even signal GD_E is at high level (and the geardown odd signal GD_O is at low level), the second divided even clock signal CK2N_E may be selected. Conversely, if the geardown odd signal GD_O is at high level (and the geardown even signal GD_E is at low level), the second divided odd clock signal CK2N_O may be selected. These features will be described in greater detail with reference to subsequent drawings including FIG. 4.

The divider 31a may supply a signal CK2N, which corresponds to a selected one of the second divided even/odd clock signals CK2N_E and CK2N_O, to a clock multiplexer (CLK mux) 32a. The clock mux 32a receives as inputs the first divided clock signal CK1N and the one selected signal CK2N. The clock mux 32a selects CK1N or CK2N, based on geardown enable signal GD_EN, as the internal clock signal CLKA.

If the geardown enable signal GD_EN is not input, the clock mux 32a may select and output the first divided clock signal CK1N as the internal clock signal CLKA in the normal mode. If the geardown enable signal GD_EN is input, the clock mux 32a may select and output selected signal CK2N as the internal clock signal CLKA in the geardown mode. Based on this multiplexing operation, the cycle time of the internal clock signal CLKA that is output in the geardown mode may be twice the cycle time of the internal clock signal CLKA output in the normal mode.

Figure 4:
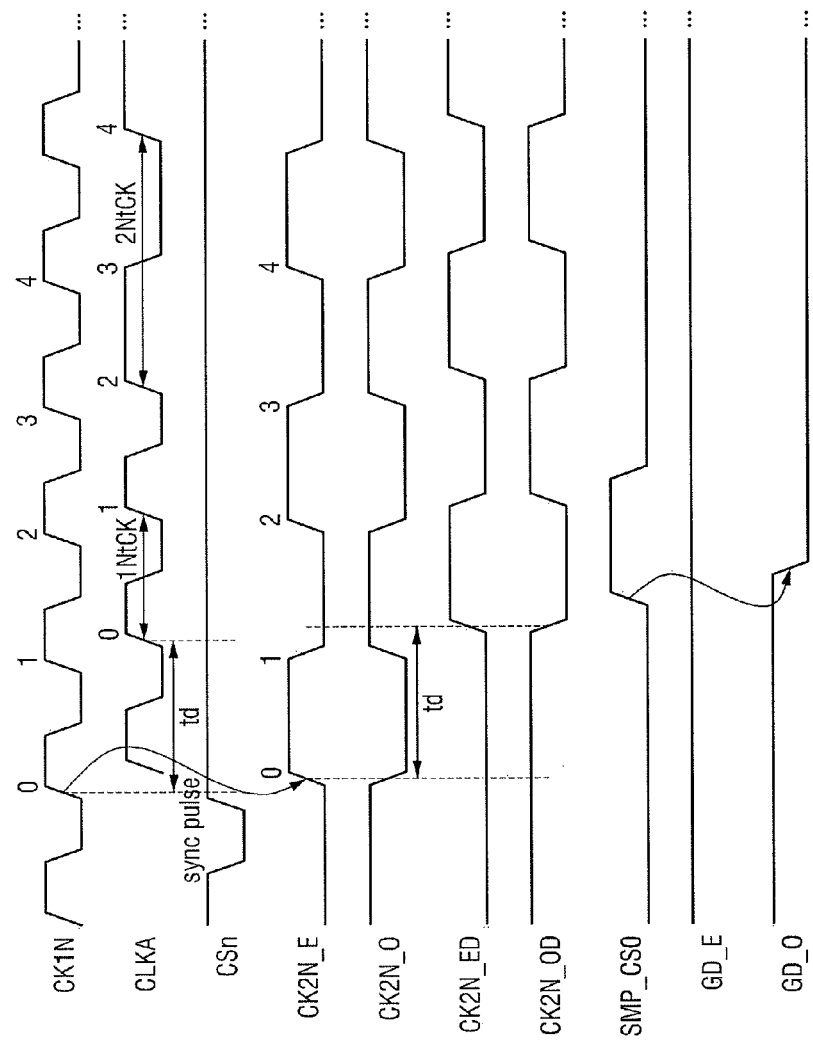
FIG. 4 illustrates an example of how some signals may change in the divided clock generation device of FIG. 3.

FIG. 4 illustrates an example of a timing diagram of signals that may change during operation of the divided clock generation device of FIG. 3. Referring to FIG. 4, the first divided clock signal CK1N may be generated, and the second divided even/odd clock signals CK2N_E and CK2N_O may be generated by the division unit 30a. The sync pulse may be a pulse of the external chip selection signal CSn.

First, the sync pulse may be input and the second divided even clock signal CK2N_E is generated by division unit 30a in synchronization with the rising edge of the first divided clock signal CK1N.

The internal clock signal CLKA may then be output by the division unit 30a. In one non-limiting implementation, the internal clock signal CLKA may initially be output as the first divided clock signal CK1N. Accordingly, in a first period (e.g., the 0-th pulse through the first pulse), the cycle time of the internal clock signal CLKA may be a first cycle time 1NtCK. The first divided clock signal CK1N may have an internal delay when passing through the division unit 30a. In FIG. 4, "td" may be used to symbolize the internal delay.

Then, the second divided even clock signal CK2N_EN that is delayed by the clock replica may be output. The clock replica may output the second divided even clock signal CK2N_ED that is delayed in the same manner as the delay td of the first divided clock signal CK1N.

Then, the chip selection signal SMP_CS0 is generated to be synchronized with the internal clock signal CLKA. More specifically, the synchronized chip selection signal SMP_CS0 may be synchronized with the 0-th pulse of the internal clock signal CLKA. In clock comparator 60, the chip selection signal SMP_CS0 that is synchronized with the internal clock signal CLKA may be compared with the delayed second divided even/odd clock signals CK2N_EN and CK2N_OD. At this time, since the first divided clock signal CK1N is output as the internal clock signal CLKA, the chip selection signal SMP_CS0 that is synchronized with the internal clock signal CLKA may indicate the delay of the first divided clock signal CK1N.

As illustrated in FIG. 4, when the chip selection signal SMP_CS0 that is synchronized with the internal clock signal CLKA is input, the delayed second divided even clock signal CK2N_ED is at high level. Thus the geardown even signal GD_E can be kept at high level. In contrast, the delayed second divided odd clock signal CK2N_OD is at low level, and the geardown odd signal GD_O may change from high level to low level. The geardown even/odd signals GD_E and GD_O may be set to high level as a default.

Next, the second divided even clock signal CK2N_E may be selected by the clock comparator 60. The second divided clock signal CK2N may be selected by the clock mux 32a and output as the internal clock signal CLKA. The second divided clock signal CK2N may be output instead of the first divided clock signal CK1N, starting, for example, from the even-numbered pulse of the internal clock signal CLKA. As a result, the cycle time of the internal clock signal CLKA in a second period (e.g., after the second pulse) may be a second cycle time 2NtCK.

On the other hand, according to the embodiment explained with reference to FIGS. 2 to 4, as divider 31a and the clock mux 32a are used, the delay of the internal clock signal in the normal mode may be increased. That is, a replica unit may be additionally arranged between the clock buffer 20 and the clock mux 32a. The additional replica unit may match the timing of the first divided clock signal CK1N input to the clock mux 32a with the timing of the one selected signal CK2N with each other. Next, a method for jointly using the internal clock signal in the normal mode and the internal clock signal in the geardown mode, without internal time delay, due to the above-described delay will be described.

Figure 5:
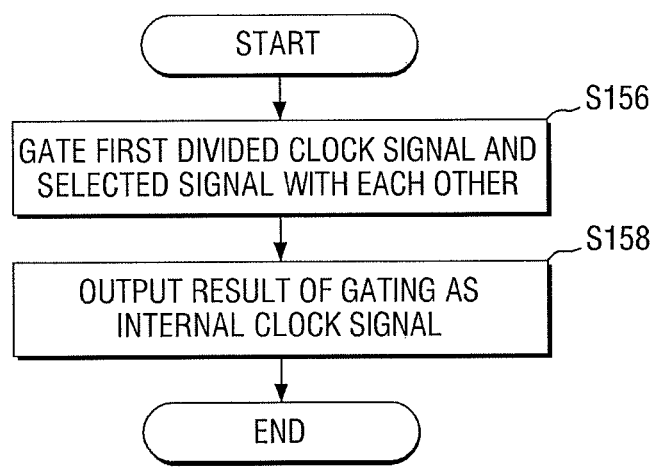
FIG. 5 illustrates another example operation of outputting an internal clock signal in a second mode of FIG. 1.

FIG. 5 illustrates an application example of outputting an internal clock signal in a second mode of FIG. 1. More specifically, FIG. 5 shows a case where the second divided clock signal is generated in synchronization with a falling edge of the first divided clock signal.

In order to output an internal clock signal in a second mode, the first divided clock signal and any one signal selected from the second divided even/odd clock signals are first gated with each other (S156). In this case, the term "gated with each other" may correspond to the case where a high-level signal is output if the two signals are all at high level, and a low-level signal is output if even one of the two signals is at low level.

The result of the gating may be output as the internal clock signal (S158). In the geardown mode, the first divided clock signal and the one selected signal are gated with each other, and only the odd-numbered pulse or the even-numbered pulse of the first divided clock signal is output. At this time, the cycle or cycle/period of the internal clock signal in the geardown mode may be smaller than ½, or 1/n.

On the other hand, in the normal mode, the internal clock signal in the normal mode is to be output. Thus, the first divided clock signal may be bypassed and output.

Figure 6:
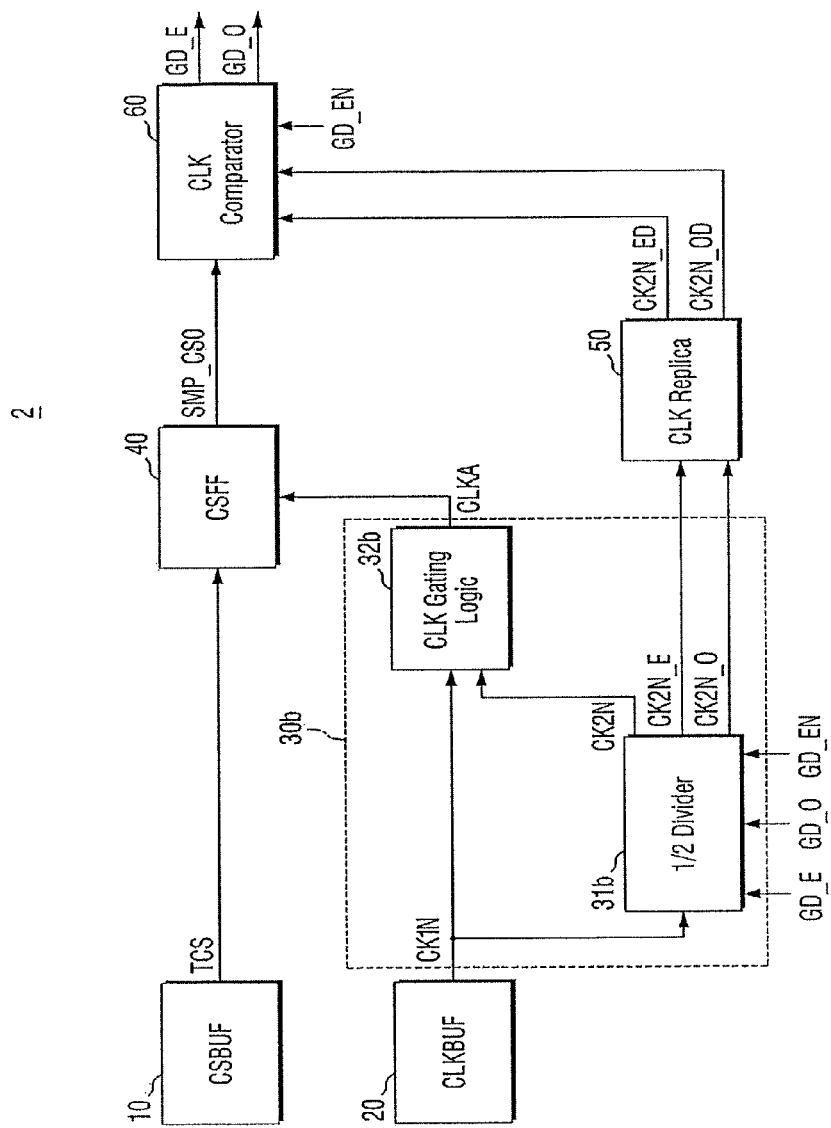
FIG. 6 illustrates an embodiment of a divided clock generation device that operates according to the method of FIG. 5.

FIG. 6 illustrates an embodiment of a divided clock generation device that operates according to the divided clock generation method of FIG. 5. Referring to FIG. 6, a divided clock generation device 2 includes a chip selection buffer (CS BUF) 10, a clock buffer (CLK BUF) 20, a division unit 30b, a chip selection flip-flop (CS FF) 40, a clock replica unit (CLK Replica) 50, and a clock comparator (CLK Comparator) 60.

The chip selection buffer 10, the clock buffer 20, the chip selection flip-flop 40, the clock replica unit 50, and the clock comparator 60 may be configured in substantially the same manner as that described referring to FIG. 3.

The division unit 30b may generate second divided even/odd clock signals CK2N_E and CK2N_O based on the first divided clock signal CK1N. For this, the division unit 30b is shown to include a ½ divider 31b. Alternatively, divider 31b may be a 1/n divider, where n is different from 2.

The divider 31b may generate the second divided clock signals CK2N_E and CK2N_O in synchronization with the first divided clock signal CK1N for two periods. The divider 31b may generate the second divided clock signals CK2N_E and CK2N_O in synchronization with a predetermined edge, for example, the falling edge, of a first divided clock bar signal CK1NB. The first divided clock bar signal CK1NB may be a complementary signal to the first divided clock signal CK1N.

The divider 31b may supply the second divided even/odd clock signals CK2N_E and CK2N_O to the clock replica 50. The divider 31b may be enabled when a geardown enable signal GD_EN is input to generate the second divided clock signals CK2N_E and CK2N_O. The divider 31b may be disabled when the gear down enable signal GD_EN is not input and may not generate the second divided clock signals CK2N_E and CK2N_O. The geardown enable signal GD_EN may correspond to the MRS geardown command as described above.

The divider 31b may supply any one signal selected from the second divided even/odd clock signals CK2N_E and CK2N_O to a clock gating logic unit (CLK Gating Logic) 32b, according to the result of the selection by clock comparator 60. The clock gating logic unit 32b may perform gating of the first divided clock signal CK1N and the one selected signal CK2N with each other. The clock gating logic unit 32b may output the result of the gating as the internal clock signal CLKA. On the other hand, the divider 31b may be disabled when the gear down enable signal GD_EN is not input, and may not generate the first divided clock signals but rather may supply a high-level signal to the clock gating logic unit 32b.

The clock gating logic unit 32b may output the first divided clock signal CK1N as the internal clock signal CLKA in the normal mode. The clock gating logic unit 32b may output only the odd-numbered pulse or the even-numbered pulse of the first divided clock signal CK1N as the internal clock signal CLKA, through gating of the first divided clock signal CK1N with the one selected signal CK2N. As a result, the cycle time of the internal clock signal CLKA, output in the geardown mode, may be twice the cycle time of the internal clock signal CLKA output in the normal mode. In other embodiments, the cycle time of the internal clock signal CLKA in the normal mode may be a different multiple or fraction of the cycle time of the internal clock signal CLKA in the geardown mode.

Figure 7:
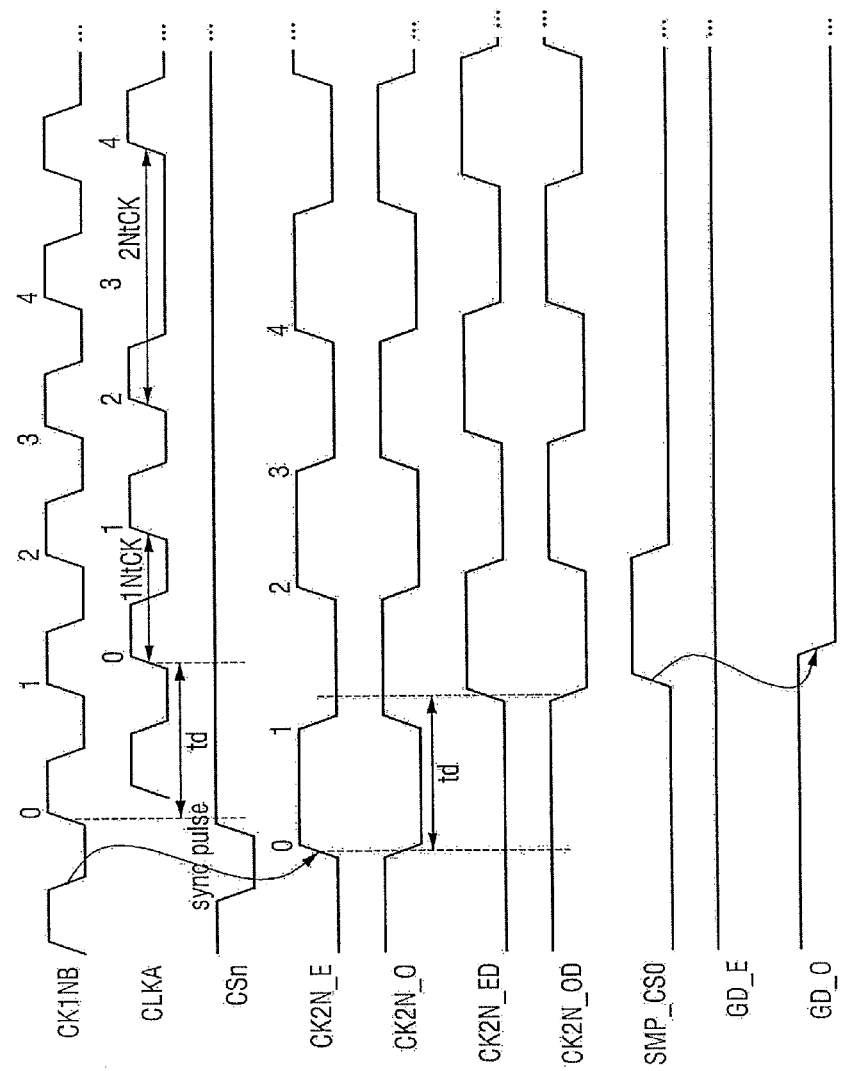
FIG. 7 illustrates an example of how some signals may change in the divided clock generation device of FIG. 6.

FIG. 7 illustrates an example of a timing diagram of some signals that change in the divided clock generation device of FIG. 6. Referring to FIG. 7, the sync pulse may be first input. Unlike FIG. 4, the second divided even clock signal CK2N_E, that is synchronized with the falling edge of the first divided clock bar signal CK1NB, may be generated by the division unit 30b.

The internal clock signal CLKA may be output by the division unit 30a. The internal clock signal CLKA may be initially output as the first divided clock signal CK1N. As a result, in a first period (e.g., the 0-th pulse through the first pulse), the cycle time of the internal clock signal CLKA may be a first cycle time 1NtCK.

The second divided even clock signal CK2N_E may be selected by the clock comparator 60, the first divided clock signal CK1N is gated with the second divided even clock signal CK2N_E by the clock gating logic unit 32b. The result of the gating may be output as the internal clock signal CLKA. The result of the gating may be output instead of the first divided clock signal CK1N, starting, for example, from the even-numbered pulse of the internal clock signal CLKA.

Figure 8:
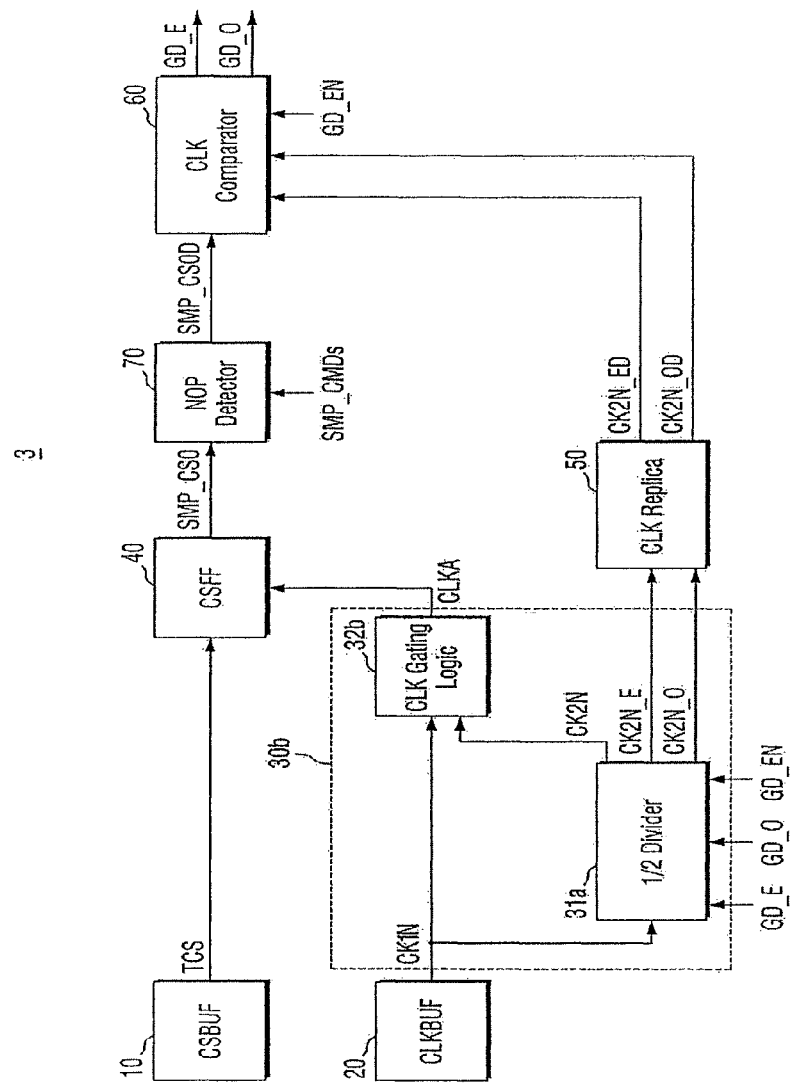
FIG. 8 illustrates an application example of the divided clock generation device of FIG. 6.

FIG. 8 illustrates an application example of the divided clock generation device of FIG. 6. Referring to FIG. 8, a divided clock generation device 3 includes a chip selection buffer (CS BUF) 10, a clock buffer (CLK BUF) 20, a division unit 30b, a chip selection flip-flop (CS FF) 40, a clock replica unit (CLK Replica) 50, a clock comparator (CLK Comparator) 60, and a non-operation detector (NOP Detector) 70.

The chip selection buffer 10, the clock buffer 20, the division unit 30b, the chip selection flip-flop 40, the clock replica unit 50, and the clock comparator 60 may be configured in substantially the same manner as that described referring to FIG. 6.

The non-operation detector 70 may be arranged between the chip selection flip-flop 40 and the clock comparator 60. The non-operation detector 70 may detect whether the command signal SMP_CMDs, synchronized with the internal clock signal CLKA, is input. As previously described, in order for the system to enter the geardown mode, a sync pulse is input together with a non-operation command. In a period before the non-operation command is input after the MRS geardown command is input, a command may be input that is not accompanied by the chip selection signal.

In this case, since the system may malfunction in the geardown mode, the non-operation detector 70 detects whether the command signal SMP_CMDs (that is synchronized with the internal clock signal) is input. If the command signal SMP_CMDs that is synchronized with the internal clock signal is detected, the non-operation detector 70 may intercept the chip selection signal SMP_CS0D that is synchronized with the internal clock signal CLKA. The non-operation detector 70 may provide the chip selection signal SMP_CS0D synchronized with the internal clock signal CLKA to the clock comparator 60, only in the case where the command signal is not detected.

Although FIG. 8 explains the application example of the divided clock generation device of FIG. 6, the above-described non-operation detector may also be applied to the divided clock generation device 1 of FIG. 3 in substantially the same manner.

Figure 9:
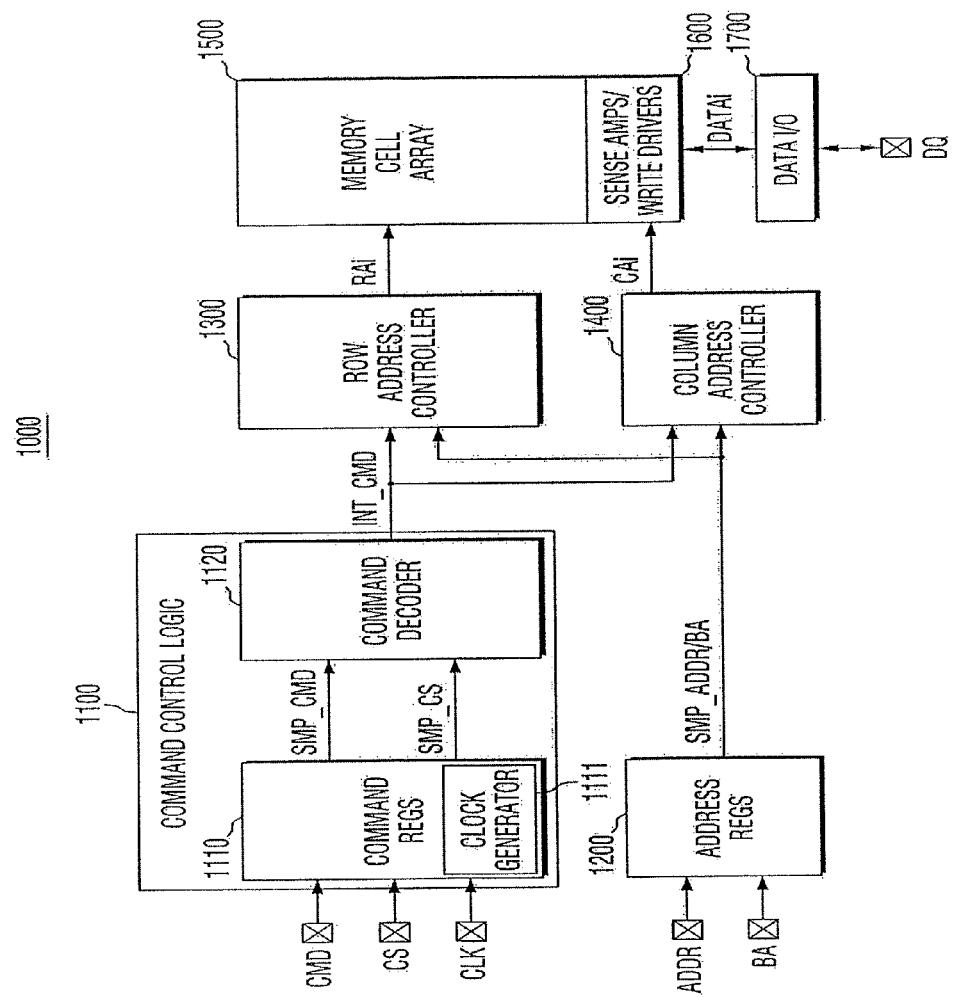
FIG. 9 illustrates an embodiment of a memory device that includes a divided clock generation device according to any of the aforementioned embodiments.

FIG. 9 illustrates an embodiment of a memory device that includes a divided clock generation device. Referring to FIG. 9, a memory device 1000 includes a command control logic (COMMAND CONTROL LOGIC) 1100, an address register (ADDRESS REGS) 1200, a row address controller (ROW ADDRESS CONTROLLER) 1300, a column address controller (COLUMN ADDRESS CONTROLLER) 1400, a memory cell array (MEMORY CELL ARRAY) 1500, a sense amplifier/write driver (SENS AMPS/WRITE DRIVERS) 1600, and a data input/output unit (DATA I/O) 1700.

The command control logic 110 is configured to generate an internal command signal INT_CMD. The command control logic 110 may be configured to include a command register (COMMAND REGS) 1110 and a command decoder (COMMAND DECODER) 1120. The command register 1110 may receive and synchronize a command signal CMD, a chip selection signal CS, and a clock signal CLK with an internal clock signal. The command decoder 1120 may receive the synchronized command signal SMP_CMD, the synchronized chip selection signal SMP_CS from the command register 1110, and generate an internal command signal INT_CMD using the above-described signals.

The command control logic 1100 may include a divided clock generator 1111 that generates the internal clock signal. The divided clock generator 1111 may output the internal clock signal having a first cycle time in a first mode, and may output the internal clock signal having a second cycle time in a second mode. The divided clock generator 1111 may be provided in substantially the same manner as the divided clock generation devices 1 to 3 as described above with reference to FIGS. 3, 6, and 8.

The address register 1200 is configured to receive an address signal ADDR and a band address signal BA, and to synchronize the above-described signals with the internal clock signal.

FIG. 9 illustrates that the divided clock generator 1111 is included in command register 1110. However, the divided clock generator 1111 may be configured separately from the command register 1110 in other embodiments. For example, the divided clock generator 1111 may be included in command control logic 1100.

The row address controller 1300 is configured to receive an internal command signal INT_CMD and a synchronized address/bank address signal SMP_ADDR/BA. The row address controller 1300 may also transmit a row address signal RAi to the memory cell array 1500.

The column address controller 1400 is configured to receive an internal command signal INT_CMD and a synchronized address/bank address signal SMP_ADDR/BA. The column address controller 1400 may transmit a column address signal CAi to the sense amplifier/write driver 1600.

The memory cell array 1500 is configured to include a plurality of memory cells that store data.

The sense amplifier/write driver 1600 is configured to read data from the memory cell selected corresponding to the row address signal RAi and the column address signal CAi. The sense amplifier/write driver 1600 may write the data on the selected memory cell.

The data input/output unit 1700 is configured to transmit/receive a data signal DQ to/from an external system, to transmit an internal data signal DATAi for writing in the memory cell array 1500 to the sense amplifier/write driver 1600, or to receive the internal data signal DATAi that is read from the memory cell array 1500 from the sense amplifier/write driver 1600.

Figure 10:
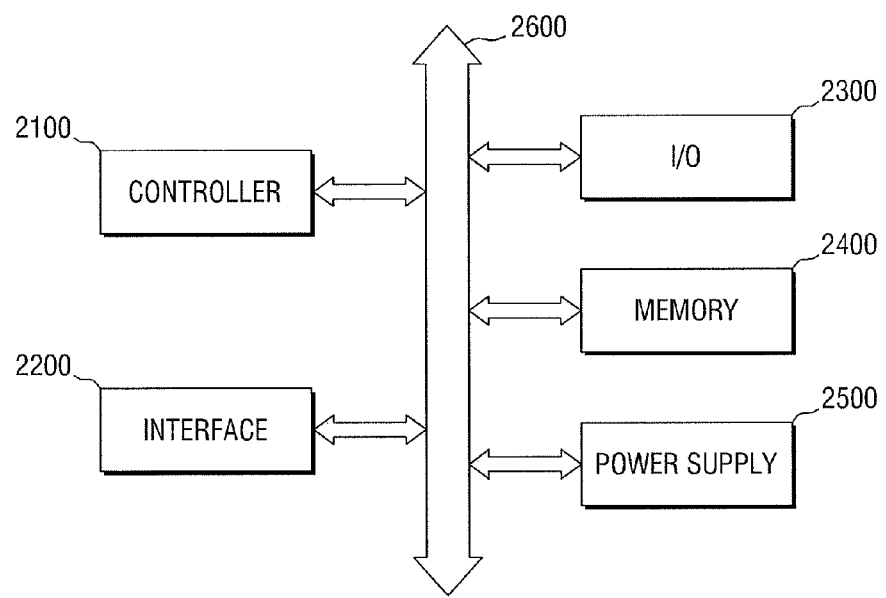
FIG. 10 illustrates an embodiment of an electronic system that includes the memory device of FIG. 9.

FIG. 10 illustrates an embodiment of an electronic system that includes the memory device of FIG. 9. Referring to FIG. 10, an electronic system 2000 may include a controller 2100, an interface 2200, an input/output (I/O) device 2300, a memory 2400, a power supply 2500, and a bus 2600.

The controller 2100, the interface 2200, the I/O device 2300, the memory 2400, and the power supply 2500 may be coupled to one another through the bus 2600. The bus 2600 corresponds to paths through which data is transferred.

The controller 2100 may include at least one of a microprocessor, a microcontroller, or logic elements that can perform similar functions, and process data.

The interface 2200 may function to transfer the data to a communication network or receive the data from the communication network. The interface 2200 may be in a wired or wireless form. For example, the interface 2200 may include an antenna or a wire/wireless transceiver.

The I/O device 2300 may include a keypad and a display device to input/output data.

The memory 2400 may store data and/or commands. The memory device 1000 described with reference to FIG. 9 may be included in memory 2400.

The power supply 2500 may convert the power input from an external source and provide power to the respective constituent elements 2100 to 2400.

In addition, the memory device described with reference to FIG. 9 may be included in various electronic devices or systems, including but not limited to a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, or a digital video player. The electronic device may also be a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A divided clock generation device, comprising:
   a chip selection flip-flop to generate a chip selection signal synchronized with an internal clock signal;
   a clock divider to generate second divided clock signals including a second divided even clock signal and a second divided odd clock signal, the clock divider to generate the second divided clock signals based on a first divided clock signal; and
   a clock comparator to select one of the second divided clock signals based on the chip selection signal, wherein the clock divider is to divide the internal clock signal based on the first divided clock signal and the selected one of the second divided clock signals, wherein the clock divider is to generate the second divided clock signals in synchronization with a predetermined edge of the first divided clock signal or a first divided clock bar signal, the first divided clock bar signal complementary to the first divided clock signal.

2. The device as claimed in claim 1, wherein:
   the clock divider is to generate the second divided clock signals in synchronization with a falling edge of the first divided clock bar signal.

3. The device as claimed in claim 2, wherein the clock divider comprises a clock gating logic to gate the first divided clock signal and the selected one of the second divided clock signals with each other and to output a result of the gating as the divided internal clock signal.

4. The device as claimed in claim 2, further comprising:
   a non-operation detector to intercept the chip selection signal synchronized with the internal clock signal provided to the clock comparator, the non-operation detector to intercept the chip selected signal based on a command signal synchronized with the internal clock signal.

5. The device as claimed in claim 1, wherein the clock divider is to generate the second divided clock signals synchronized with a rising edge of the first divided clock signal.

6. The device as claimed in claim 5, wherein the clock divider comprises a clock multiplexer to perform a multiplexing operation for the first divided clock signal and the selected one of the second divided clock signals and to output a result of the multiplexer operation as the divided internal clock signal.

7. The device as claimed in claim 1, wherein:
   the first divided clock signal is initially output as the internal clock signal, and
   the clock comparator is to select one of the second divided clock signals based on a comparison of delays of the first divided clock signal and the second divided clock signals.

8. The device as claimed in claim 1, wherein a frequency of the second divided clock signal is ½ of a frequency of the first divided clock signal.

9. A The divided clock generation device, comprising:
   a chip selection flip-flop to generate a chip selection signal synchronized with an internal clock signal;
   a clock divider to generate second divided clock signals including a second divided even clock signal and a second divided odd clock signal, the clock divider to generate the second divided clock signals based on a first divided clock signal;
   a clock comparator to select one of the second divided clock signals based on the chip selection signal; and a replica logic to delay the second divided clock signals in substantially a same manner as a delay of the first divided clock signal and to provide the delayed signals to the clock comparator, wherein the clock divider is to divide the internal clock signal based on the first divided clock signal and the selected one of the second divided clock signals, and wherein the first divided clock signal is initially output as the internal clock signal.

10. The device as claimed in claim 1, further comprising:
a chip selection buffer to convert the chip selection signal from a TTL level to a CMOS level, and to output the converted chip selection signal to be received by to the chip selection flip-flop.

11. A method for generating clock signals, the method comprising:
outputting a first divided clock signal as an internal clock signal;
generating second divided clock signals based on the first divided clock signal, the second divided clock signals including a second divided even clock signal and a second divided odd clock signal;
generating a chip selection signal synchronized with the internal clock signal;
selecting one of the second divided clock signals based on the chip selection signal; and
dividing the internal clock signal based on the first divided clock signal and the selected one of the second divided clock signals.

12. The method as claimed in claim 11, wherein the second divided clock signals are generated in synchronization with a falling edge of the first divided clock bar signal.

13. The method as claimed in claim 12, wherein outputting the internal clock signal is performed according to a result of gating the first divided clock signal and the selected one of the second divided clock signals with each other, a result of the gating to be output as the divided internal clock signal.

14. The touch screen panel as claimed in claim 9, wherein the color printing layer, the white printing layer, the metal filler layer, and the black printing layer are all different from one another.

15. The touch screen panel as claimed in claim 1, wherein the color printing layer is between an outermost one of the conductive sensing cells and the edge of the surface of the transparent substrate.

16. A device, comprising:
a logic circuit to generate a chip selection signal;
a divider to generate first and second divided clock signals based on a first clock signal; and
a comparator to select the first or second divided clock signal based on the chip selection signal, wherein the first divided clock signal is synchronized with a predetermined edge of the first clock signal or a first divided clock bar signal and wherein the second divided clock signal is delayed relative to the first divided clock signal, the first divided clock bar signal complementary to the first divided clock signal.

17. The device as claimed in claim 16, further comprising:
a selection circuit to select the first clock signal or one of the first or second divided clock signals, wherein: the logic circuit is to generate the chip selection signal based on the signal selected by the selection circuit.

18. The device as claimed in claim 17, wherein:
the first clock signal has first cycle time, and
each of the first and second clock signals have a second cycle time longer than the first cycle time.

19. The device as claimed in claim 16, wherein the divider is a ½ divider.

20. The device as claimed in claim 16, wherein the logic circuit includes a flip-flop.

* * * * *

UNITED STATES PATENT AND TRADEMARK OFFICE
CERTIFICATE OF CORRECTION

PATENT NO.         : 9,088,287 B2                                        Page 1 of 1
APPLICATION NO.    : 14/193595
DATED              : July 21, 2015
INVENTOR(S)        : Hun-Dae Choi and In-Dal Song It is certified that error appears in the above-identified patent and that said Letters Patent is hereby corrected as shown below:

On the Title Page

Foreign Application Priority Data, Item (30) should read:

--Mar. 6, 2013  (KR)            10-2013-0024126--

Signed and Sealed this
Twenty-fourth Day of November, 2015

Michelle K. Lee
*Director of the United States Patent and Trademark Office*